United States Patent [19]
Fiordalice et al.

[11] Patent Number: 5,633,199
[45] Date of Patent: May 27, 1997

[54] PROCESS FOR FABRICATING A METALLIZED INTERCONNECT STRUCTURE IN A SEMICONDUCTOR DEVICE

[75] Inventors: Robert W. Fiordalice; Roc Blumenthal, both of Austin, Tex.

[73] Assignee: Motorola Inc., Schaumburg, Ill.

[21] Appl. No.: 556,787

[22] Filed: Nov. 2, 1995

[51] Int. Cl.⁶ .................................................. H01L 21/28
[52] U.S. Cl. ........................ 438/642; 438/652; 438/660; 438/688
[58] Field of Search ........................... 437/188, 189, 437/194, 197, 198, 246, 195; 204/192.17

[56] References Cited

U.S. PATENT DOCUMENTS

| | | | |
|---|---|---|---|
| 5,008,217 | 4/1991 | Case et al. | 437/195 |
| 5,147,819 | 9/1992 | Yu et al. | 437/173 |
| 5,148,259 | 9/1992 | Kato et al. | 437/194 |
| 5,356,836 | 10/1994 | Chen et al. | 437/194 |
| 5,358,616 | 10/1994 | Ward | 437/194 |
| 5,442,235 | 8/1995 | Parrillo et al. | 257/758 |

FOREIGN PATENT DOCUMENTS

| | | |
|---|---|---|
| 0480580 | 4/1992 | European Pat. Off. . |
| 06097169 | 4/1994 | Japan . |
| WO9419826 | 9/1994 | WIPO . |

OTHER PUBLICATIONS

Mayday, Dan, "Cluster Tools for Fabrication of Advanced Devices," Extended Abstracts of the 22nd (1990 Int'l.) Conference on Solid State Devices & Materials, Aug. 22–24, 1980, pp. 849–852.

Singer, Pete, "The Interconnect Challenge: Filling Small, High Aspect Ration Contact Holes," Aug. 1994, Semiconductor International, pp. 57–64.

Cheung, K. P. et al., "Improved CVD Aluminum Deposition Using In-Situ Sputtered Nucleation Layers," Jun. 12–13, 1990, VLSI Multilevel Interconnection Conference, pp. 303–309.

Onuki, Jin et al., "Study on step coverage and (111) preferred orientation of aluminum film deposited by a new switching bias sputtering method," Appl. Phys. Lett. 53, Sep. 12, 1988, pp. 968–970.

Chen, F. S. et al., "Advanced Planarized Aluminum Metallization Process," Materials Research Society Symposium Proceedings, vol. 260, Apr. 27–May 1, 1992, pp. 617–622.

S. Wolf "Silicon Processing for the VLSI Era*, vol. 2.", Lattice Press, 1990, p. 264.

*Primary Examiner*—John Niebling
*Assistant Examiner*—Thomas G. Bilodeau
*Attorney, Agent, or Firm*—Jasper W. Dockrey

[57] ABSTRACT

A process for fabricating a metallized interconnect structure in a semiconductor device includes the steps of depositing a first aluminum layer (22) into a via opening (16) in a dielectric layer (18). A doping layer (24) is deposited by high density plasma sputtering to form a portion thereof in the bottom of the via opening (16). A second aluminum layer (26) is chemical vapor deposited to overlie the doping layer (24) and to fill the via opening (16). An annealing process can then be carried out to diffuse metal dopants from the doping layer (24) into nearby metal regions to provide a uniformly doped metal region within the via opening (16).

7 Claims, 2 Drawing Sheets

PROCESS FOR FABRICATING A METALLIZED INTERCONNECT STRUCTURE IN A SEMICONDUCTOR DEVICE

FIELD OF THE INVENTION

This invention relates, in general, to a method for fabricating a semiconductor device, and more particularly, to a method for fabricating a metallized interconnect structure in a high-aspect-ratio via.

BACKGROUND OF THE INVENTION

There is a continuing trend in the semiconductor industry to fabricate integrated circuits of increasing complexity. The fabrication of extremely complex, high-density integrated circuits has been made possible through advances in integrated circuit fabrication technology. Fabrication technology now exists having the capability to define circuit components having feature sizes in the sub-micron size range. For example, new lithographic techniques have been developed using x-ray and pulse-laser energy sources. Additionally, film deposition technology now exists with the capability to form thin-films having precisely determined metallurgical compositions and thicknesses. Furthermore, film deposition techniques have been developed which are capable of directionally depositing metal films in precisely defined locations during device fabrication.

To maintain a small die size, high-density integrated circuits are now commonly fabricated with multiple levels of metal interconnects. Typically, the metal interconnect layers are separated by interlevel dielectric (ILD) layers and electrically coupled by metal-filled vias residing at selected locations in the ILD layers. The vias are filled by a metal plug which provides an electrical conduit between stacked metal interconnect layers. Typically, the metal plug is a refractory metal such as tungsten.

Tungsten has become an increasingly popular material for the formation of metallized via plugs. Tungsten possesses high electrical conductivity and can be readily deposited into high-aspect-ratio vias. Additionally, a variety of deposition processes are available for the formation of both blanket tungsten and selectively deposited tungsten. However, the physical properties of tungsten differ substantially from the physical properties of aluminum and aluminum alloys. Tungsten is a mechanically hard, high-density metal having a high melting point. In contrast, aluminum is a soft, ductile metal having a relatively low melting point, and is further characterized by a large grain structure. When electrons flow from hard metals, such as tungsten, to a softer metal, such as aluminum, a flux divergence occurs at the metallic interface. In the softer metal, the flow of electrons pushes metal atoms in the softer metal away from the interface. This phenomenon is known as electromigration and severely degrades the current handling capability of the metallization structure. Because tungsten has a high density and melting point, it does not experience a mechanical deformation when subjected to a high electrical current. Moreover, tungsten does not self-diffuse when subjected to high electrical current. Therefore, electromigration of the softer metal, in the direction of electron flow, causes a void at the tungsten-aluminum interface.

In view of the mechanical deformation characteristics associated with the use tungsten filled vias, there is a renewed interest in the fabrication of metal interconnect structures using aluminum and aluminum alloys exclusively. However, even with the use of aluminum and its alloys, highly reliable interconnect structures require the use of a dopant, such as copper, and the like, to resist void formation caused by electromigration in the metallized interconnect. While chemical vapor deposition techniques using metal organic precursors have expanded the use of chemical vapor deposition as a method for depositing an aluminum and aluminum alloy, the deposition of a uniformly doped metal in a high aspect-ratio via is difficult to obtain. Additionally, conventional metal sputtering does not provide a conformally deposited metal layer, such that all surfaces of a high-aspect-ratio via can be completely covered with metal. Accordingly, an improved process is necessary for the fabrication of a reliable metallized interconnect structure in high aspect-ratio via openings.

SUMMARY OF THE INVENTION

In practicing the present invention there is provided a process for fabricating a metallized interconnect structure in a semiconductor device that includes the use of chemical vapor deposition and high density plasma sputtering to provide an electromigration resistant metallized contact structure. In one embodiment of the invention, a dielectric layer is provided having a via opening therein. The via opening is characterized by a substantially vertical sidewall and a bottom surface. A first aluminum layer is formed to overlie the substantially vertical sidewalls and the bottom surface. Then, a doping layer is formed to overlie the first metal layer, wherein the doping layer is confined to a portion of the first metal layer overlying the bottom surface within the via opening. Finally, the via opening is filled with a second aluminum layer.

Figure 1:
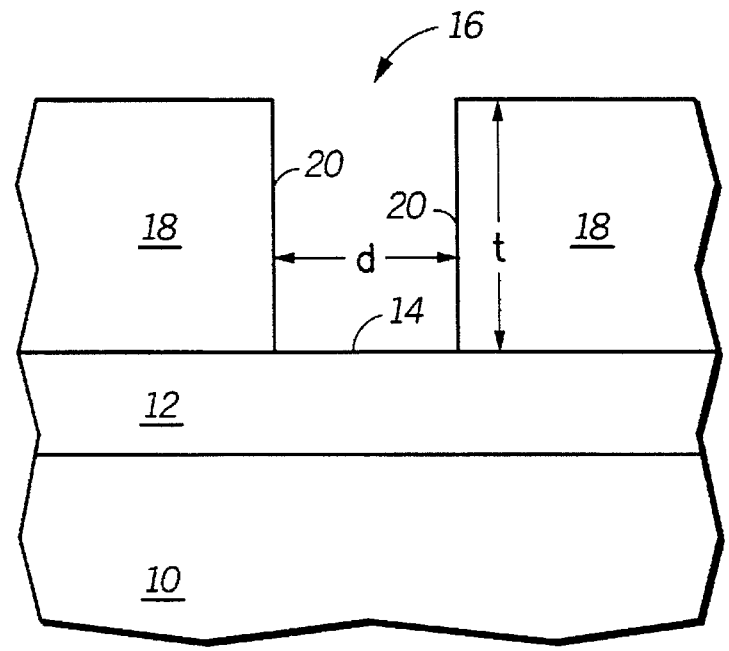
FIGS. 1-4 illustrate, in cross-section, process steps in accordance with one embodiment of the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENT

The present invention provides a process for fabricating a metallized interconnect structure in a VLSI integrated circuit device. The method of the invention advantageously combines the directional deposition characteristics of high density plasma sputtering with the conformal deposition characteristics of chemical vapor deposition. The combination of metal deposition processes provides a technique for fabricating metallized interconnect structures independent of a refractory metal plug. The metallized contact structure of the invention can be completely fabricated using aluminum, aluminum alloys, copper, and copper alloys, and the like. Improved long-term reliability of the interconnect structure is obtained by eliminating the need for a tungsten plug in the interconnect structure. Additionally, the combination of high density plasma sputtering and chemical vapor deposition provides an effective method for placing dopants, such as copper, copper alloys, and the like, deep within a high-aspect ratio via opening commonly used in very-large-scale-integration (VLSI) integrated circuit devices.

FIG. 1 illustrates, in cross-section, a portion of a semiconductor substrate 10 having already undergone several process steps in accordance with one embodiment of the invention. A device layer 12 overlies semiconductor substrate 10 and a surface portion 14 of device layer 12 is exposed by an opening 16 in an overlying dielectric layer 18. Since the present invention contemplates the fabrication of metallized interconnect structures in a variety of integrated circuit components, device layer 12 is generally represented to be either an electrically conductive metal lead, a diffusion region within a single crystal silicon substrate, an electrically conductive element of an integrated circuit device component, and the like. Accordingly, opening 16 can be a via opening through which overlying metal leads can be interconnected, or alternatively, a contact opening through which a conductive lead is electrically coupled to a doped region within a single crystal silicon substrate.

Typically, in VLSI integrated circuit devices opening 16 will have a high aspect ratio. For example, the diameter of opening 16, denoted by the letter "d" in FIG. 1, will be less than 1 micron and can be 0.5 microns or less. The need to effectively isolate overlying metal leads requires that dielectric layer 18 have a thickness sufficient to prevent electrical communication between overlying metal leads. Additionally, processing techniques used to maintain planar surfaces during fabrication require that dielectric layer 18 be deposited to a thickness sufficient to withstand planarization processes such as chemical-mechanical-polishing (CMP). Accordingly, dielectric layer 18 will commonly have a thickness greater than 1 micron, and typically 1.0 to 1.5 microns. The aspect ratio is defined as the thickness "t", shown in FIG. 1, divided by the diameter of the opening "d" (t/d).

As the aspect ratio increases, it becomes more difficult to employ conventional chemical vapor deposition techniques to fill opening 16 with an electrically conductive metal having a uniform concentration of a metal impurity. However, the fabrication of a high reliability metal interconnect structure requires that side wall 20 of opening 16 and surface portion 14 be continuously coated with a layer of metal.

Figure 2:
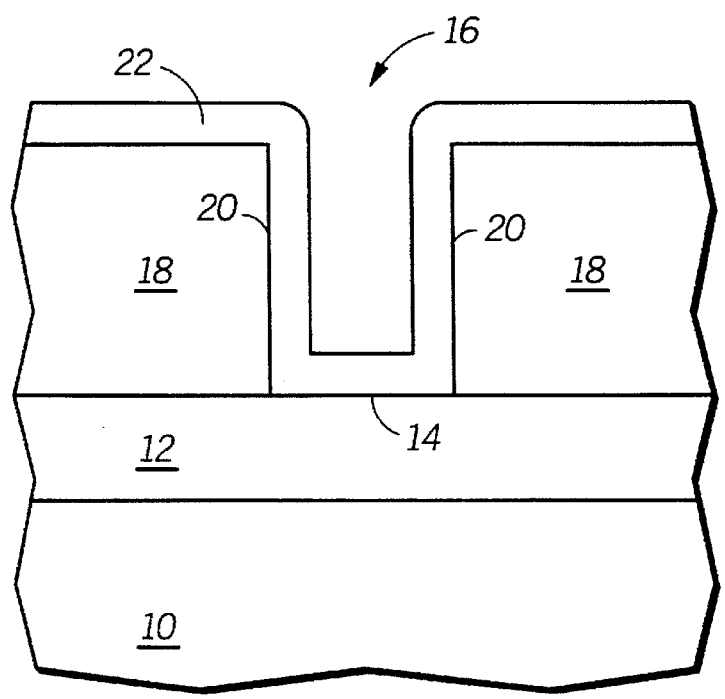

Pursuant to the present invention, a first aluminum layer 22 is deposited by chemical vapor deposition, as illustrated in FIG. 2. Preferably, a layer of aluminum, or an aluminum alloy, is chemical vapor deposited to a thickness equal to about ¼ to ⅓ of the thickness of the dielectric layer 18. In a most preferred embodiment a thin, sputtered aluminum nucleation layer (not shown) is first formed in opening 16 prior to depositing first aluminum layer 22. The nucleation layer provides a smooth metal surface upon for the chemical vapor deposition of aluminum. During the chemical vapor deposition process, the smooth surface texture of the sputtered nucleation layer is propagated throughout first aluminum layer 22. Although the use of a sputtered aluminum nucleation layer improves the specularity and surface texture of chemical vapor deposited aluminum, the use of the nucleation layer is an optional process in the present invention and the advantages of the present invention can be fully realized independent of the nucleation layer.

In the chemical vapor deposition process, metal organic source gases are used to deposit an aluminum or aluminum alloy layer at a temperature of about 215° to 325° C., and a deposition pressure of about 500 millitorr to about 100 torr. Preferably, dimethyl aluminum hydride (DMAH) is used as a deposition precursor. Alternatively, other metal organic precursors, such as triisobutyl aluminum (TIBA), trimethyl aluminum (TMA), trimethyl aluminum alane (TMAA), triethyl aluminum, and aluminum monochloride, and the like, can be used. As depicted in FIG. 2, the first aluminum layer 22 conformally covers the upper surface of dielectric layer 18, sidewall 20 of opening 16, and surface portion 14 of device layer 12.

Figure 3:
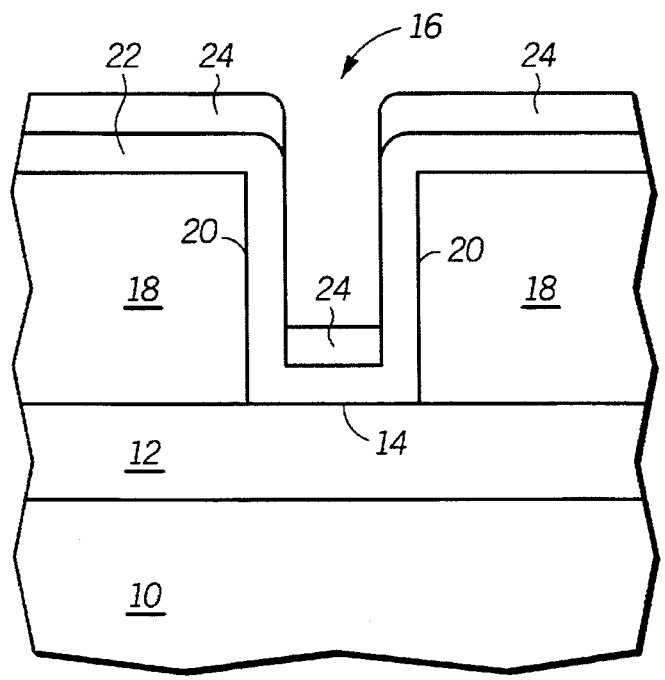

After depositing first aluminum layer 22, a doping layer 24 is directionally deposited to overlie first aluminum layer 22, as illustrated in FIG. 3. Preferably, doping layer 24 is a metal alloy containing at least one metal impurity useful for the prevention of voids in a metallized contact structure. Voids can form a metallized contact structure as the result of electromigration phenomenon taking place when electrical current flows through a metallized contact structure. To counter metal discontinuity caused by electromigration, a doping impurity, such as copper, chrome, titanium, nickel, and the like, can be placed at the point of flux divergence in the metallized contact structure. The dopant metal occupies interstitial regions in the metal lattice and retards the movement metal ions under the influence of the electron flux, thus reducing mechanical deformation of the metallized interconnect structure.

In a preferred embodiment, doping layer 24 is an aluminum-copper alloy containing about 0.5 to about 2.0 weight percent copper. Alternatively, doping layer 24 can be a titanium-copper alloy, or pure copper. Although copper is the preferred metal dopant, other metals, such as chrome, titanium, and nickel, and the like, can be deposited as aluminum alloys to improve the electromigration resistance of the metallized contact structure.

As illustrated in FIG. 3, doping layer 24 is directionally deposited such that a region of doping layer 24 is formed in the bottom of opening 16 and overlies a portion of first aluminum layer 22 that in turn overlies surface portion 14 of device layer 12. Those skilled in the art will appreciate that because of the high aspect ratio of opening 16, the placement of a metal alloy region, such as doping layer 24, in the bottom of opening 16 can be extremely difficult.

To insure the placement of a portion of doping layer 24 in the bottom of opening 16, doping layer 24 is preferably deposited by high density plasma sputtering. The high density plasma sputtering process can be carried out by either inductively coupled plasma (ICP) sputtering, or by electron cyclotron resonance (ECR) sputtering. In the ICP process, doping layer 24 is plasma sputtered at a temperature of about 20° to 500° C. and at a pressure of about 5 to 100 millitorr. An inert gas, such as argon, xenon, krypton, and the like, is used to sputter the alloy from a target powered with about 500 to 20,000 watts RF. The ICP system is operated at a coil frequency of about 400 KHz to about 60 MHz, and a pedestal frequency of about 0 to 60 MHz. In the ECR process, the deposition of doping layer 24 is carried out at a temperature of about 0° to 400° C. and a chamber pressure of about 0.2 to about 5.0 millitorr. The ECR system is operated at a microwave input power of about 50 to 2,000 watts RF and at an ECR frequency of about 2.45 GHz.

By employing one of the high density plasma sputtering processes described above, a doped metal layer can be placed into the bottom of a contact opening having a high aspect ratio. For example, it is within the scope of the invention that a doped metal layer be formed in the bottom of a via opening having a diameter of 0.6 microns or less and an aspect ratio of 2:1 or greater. The inventive process provides a technique for placing metal dopant at the point in a via opening where flux divergence is particularly strong and where mechanical deformation of the contact structure is likely to occur.

Figure 4:
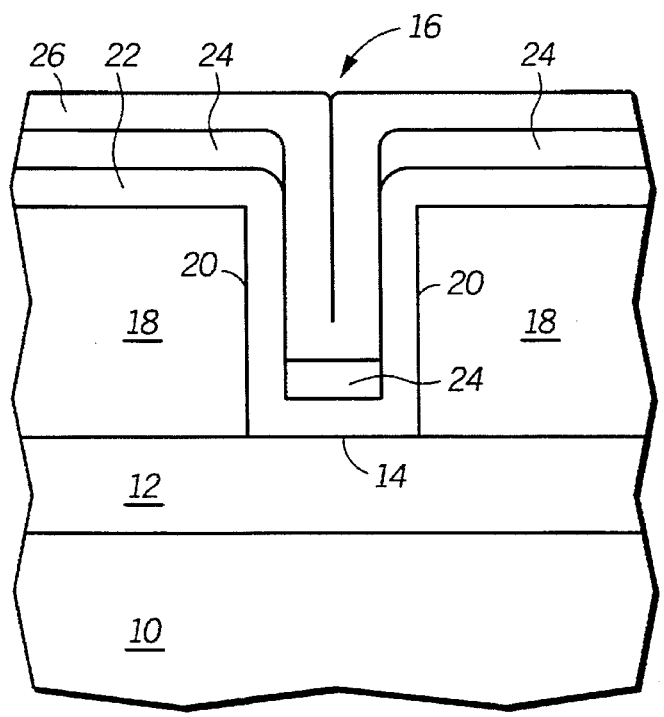

At this point in the process, high density plasma sputtering deposition used to form doping layer 24 can be continued, such that opening 16 is completely filled with a sputtered metal layer. Although the process is highly directional, with sufficient time a sputtered layer of metal will completely fill the opening. Alternatively, as illustrated in FIG. 4, a second aluminum layer 26 can be chemical vapor deposited to overlie doping layer 24 and to fill opening 16. As in the chemical vapor deposition of first aluminum layer 22, the deposition process used to form second aluminum layer 26 conformally deposits a layer of aluminum over all exposed surfaces of the contact structure, thus filling opening 16 with aluminum metal. Once second aluminum layer 26 has been deposited, a thermal annealing process can be carried out to diffuse metal dopants from doping layer 24 into nearby metal region to provide a uniform metal dopant concentration in the metal layers filling contact opening 16. Finally, the metal interconnect layers can be photolithographically patterned and etched to form metal interconnect leads overlying the surface of dielectric layer 18.

It is important to note that upon completion of the deposition and patterning process a metal interconnect structure has been formed through a high-aspect-ratio via without the need to use a refractory metal. By using chemical vapor deposition and sputtering techniques to construct a metallized interconnect structure, the process for fabricating such a structure is simplified. Elimination of the refractory metal plug obviates the need to deposit a refractory metal and then planarize the refractory metal to form a via plug. Additionally, the process of the invention has provided a uniformly doped metallized interconnect in a high-aspect-ratio via.

Thus it is apparent that there has been provided, in accordance with the invention, a process for fabricating a metallized interconnect structure in a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, cluster tool deposition processes can be used to deposit the various metal layers and additional oxide removal steps can be used. It is therefore intended to include within the invention all such variations and modifications as fall within the scope of the appended claims and equivalents thereof.

We claim:

1. A process for fabricating a metallized interconnect structure in a semiconductor device comprising the steps of:

providing a dielectric layer having a via opening therein, wherein the via opening is characterized by substantially vertical sidewalls and a bottom surface;

chemical vapor depositing a first aluminum layer to overlie the substantially vertical sidewalls and the bottom surface;

forming a doping layer comprising chrome overlying the first aluminum layer, wherein the doping layer within the via opening is confined to a portion of the first aluminum layer overlying the bottom surface; and chemical vapor depositing a second aluminum layer to overlie the doping layer and to fill the via.

2. The process of claim 1, wherein the step of forming a doping layer comprises plasma sputtering of an aluminum-chrome alloy.

3. A process for fabricating a metallized interconnect structure in a semiconductor device comprising the steps of:

providing a substrate having a dielectric layer thereon, wherein the dielectric layer has an upper surface;

forming an opening in the dielectric layer, wherein the opening is characterized by substantially vertical sidewalls and a bottom surface;

chemical vapor depositing a first aluminum layer into the opening, wherein the first aluminum layer overlies the substantially vertical sidewalls and the bottom surface;

sputtering a doping layer comprising copper onto the first aluminum layer, wherein the doping layer overlies the first aluminum layer at the bottom surface of the opening and at the upper surface of the dielectric layer; and chemical vapor depositing a second aluminum layer onto the second aluminum layer to fill the opening.

4. The process of claim 3, wherein the step of sputtering a doping layer comprises sputtering a copper alloy selected from the group consisting of aluminum-copper and titanium copper.

5. The process of claim 3, wherein the step of sputtering a doping layer comprises sputtering a layer of copper metal.

6. The process of claim 3, wherein the step of sputtering a doping layer is further characterized as directionally sputtering the doping layer.

7. A process for fabricating a metallized interconnect structure in a semiconductor device comprising the steps of:

providing a semiconductor substrate having a dielectric layer thereon, wherein the dielectric layer has an opening therein exposing a contact region of the semiconductor substrate;

chemical vapor depositing a first metal layer comprising aluminum overlying the dielectric layer and the contact region of the semiconductor substrate;

directionally depositing a doping layer into the opening, wherein the doping layer contains a metal impurity selected from the group consisting of copper, nickel and chrome;

chemical vapor depositing a second metal layer comprising aluminum to overlie the doping layer and fill the opening; and annealing the semiconductor substrate to diffuse the metal impurity into the first and second metal layers.

* * * * *